(12) United States Patent
Xie (10) Patent No.: US 11,121,228 B2
(45) Date of Patent: Sep. 14, 2021

(54) MANUFACTURING METHOD OF THIN FILM TRANSISTOR

(71) Applicant: SHENZHEN CHINA STAR OPTOELECTRONICS SEMICONDUCTOR DISPLAY TECHNOLOGY CO., LTD., Guangdong (CN)

(72) Inventor: Huafei Xie, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 510 days.

(21) Appl. No.: 16/080,620

(22) PCT Filed: Aug. 2, 2018

(86) PCT No.: PCT/CN2018/098269
§ 371 (c)(1),
(2) Date: Aug. 28, 2018

(87) PCT Pub. No.: WO2020/019364
PCT Pub. Date: Jan. 30, 2020

(65) Prior Publication Data
US 2021/0098590 A1    Apr. 1, 2021

(30) Foreign Application Priority Data

Jul. 23, 2018 (CN) .......................... 201810812806.9

(51) Int. Cl.
*H01L 29/45* (2006.01)
*H01L 21/02* (2006.01)
(Continued)

(52) U.S. Cl.
CPC ........ *H01L 29/45* (2013.01); *H01L 21/02532* (2013.01); *H01L 21/02576* (2013.01);
(Continued)

(58) Field of Classification Search
CPC . H01L 29/45; H01L 29/786; H01L 29/66742; H01L 29/401; H01L 21/02532;
(Continued)

(56) References Cited

U.S. PATENT DOCUMENTS

2003/0124863 A1* 7/2003 Hwang ............. H01L 29/66757
438/694
2003/0141494 A1* 7/2003 Govyadinov ........... H01J 1/312
257/10
(Continued)

FOREIGN PATENT DOCUMENTS

CN       105161541 A      12/2015
CN       106847837 A       6/2017
(Continued)

*Primary Examiner* — Charles D Garber
*Assistant Examiner* — S M Sohel Imtiaz
(74) *Attorney, Agent, or Firm* — Leong C. Lei (57) ABSTRACT

Disclosed is a manufacturing method of a thin film transistor, comprising: sequentially preparing a gate, a gate insulation layer and an active layer on the substrate; preparing an etching stopper layer on the active layer; depositing an ohmic contact layer film on the etching stopper layer and the active layer, and depositing a source drain conductive film on the ohmic contact layer film; processing the source drain conductive film to form a source and a drain, which are patterned, and processing the ohmic contact layer film by a dry etching process to form an ohmic contact layer, which is patterned; removing the etching stopper layer after preparing the ohmic contact layer. Since the etching stopper layer is disposed above the channel of the transistor before preparing the ohmic contact layer, the damage to the active layer by
(Continued)

dry etching can be effectively avoided to improve the performance of the transistor.

18 Claims, 5 Drawing Sheets

(51) Int. Cl.

| | |
|---|---|
| *H01L 21/04* | (2006.01) |
| *H01L 21/443* | (2006.01) |
| *H01L 27/12* | (2006.01) |
| *H01L 29/16* | (2006.01) |
| *H01L 29/24* | (2006.01) |
| *H01L 29/40* | (2006.01) |
| *H01L 29/66* | (2006.01) |
| *H01L 29/76* | (2006.01) |
| *H01L 29/786* | (2006.01) |
| *H01L 51/00* | (2006.01) |
| *H01L 51/05* | (2006.01) |
| *H01L 51/10* | (2006.01) |

(52) U.S. Cl.
CPC ........ *H01L 21/043* (2013.01); *H01L 21/0485* (2013.01); *H01L 21/443* (2013.01); *H01L 27/127* (2013.01); *H01L 27/1214* (2013.01); *H01L 27/1259* (2013.01); *H01L 29/1606* (2013.01); *H01L 29/1608* (2013.01); *H01L 29/24* (2013.01); *H01L 29/401* (2013.01); *H01L 29/66045* (2013.01); *H01L 29/66068* (2013.01); *H01L 29/66742* (2013.01); *H01L 29/66969* (2013.01); *H01L 29/7606* (2013.01); *H01L 29/786* (2013.01); *H01L 51/0048* (2013.01); *H01L 51/0545* (2013.01); *H01L 51/105* (2013.01)

(58) Field of Classification Search
CPC ........... H01L 21/02576; H01L 27/1214; H01L 27/1259; H01L 21/043; H01L 51/0545; H01L 51/105; H01L 29/66045
See application file for complete search history.

(56) References Cited

U.S. PATENT DOCUMENTS

| | | | | |
|---|---|---|---|---|
| 2006/0103773 | A1* | 5/2006 | Suh | H01L 51/0016 349/43 |
| 2008/0265293 | A1* | 10/2008 | Lee | H01L 29/0665 257/288 |
| 2009/0111255 | A1* | 4/2009 | Eun | H01L 29/66545 438/589 |
| 2011/0186842 | A1 | 8/2011 | Moon et al. | |
| 2011/0266537 | A1 | 11/2011 | Ye | |
| 2011/0267562 | A1* | 11/2011 | Yashiro | G06F 3/0412 349/62 |
| 2013/0043467 | A1* | 2/2013 | Takechi | H01L 29/78696 257/43 |
| 2013/0056728 | A1* | 3/2013 | Morosawa | H01L 29/78606 257/43 |
| 2014/0197404 | A1* | 7/2014 | Chiang | H01L 29/7869 257/43 |
| 2015/0097163 | A1* | 4/2015 | Kanno | H01L 27/283 257/40 |
| 2016/0197165 | A1 | 7/2016 | Kim et al. | |
| 2016/0268320 | A1* | 9/2016 | Long | H01L 27/1288 |
| 2016/0315195 | A1* | 10/2016 | Ning | H01L 29/45 |
| 2017/0077246 | A1 | 3/2017 | Yun et al. | |
| 2017/0365718 | A1* | 12/2017 | Shieh | H01L 29/7869 |
| 2018/0026141 | A1* | 1/2018 | Ikeda | H01L 21/28 257/347 |
| 2018/0212050 | A1* | 7/2018 | Chung | H01L 27/1288 |
| 2018/0226507 | A1* | 8/2018 | Chen | H01L 51/0512 |

FOREIGN PATENT DOCUMENTS

| | | |
|---|---|---|
| CN | 107393932 A | 11/2017 |
| CN | 107706115 A | 2/2018 |
| CN | 108231674 A | 6/2018 |

* cited by examiner

MANUFACTURING METHOD OF THIN FILM TRANSISTOR

RELATED APPLICATIONS

The present application is a National Phase of International Application Number PCT/CN2018/098269, filed Aug. 2, 2018, and claims the priority of China Application No. 2018/10812806.9, filed Jul. 23, 2018.

FIELD OF THE INVENTION

The present invention relates to a semiconductor manufacturing field, and more particularly to a manufacturing method of a thin film transistor.

BACKGROUND OF THE INVENTION

The discovery of new semiconductor materials, such as graphene, carbon nanotubes, silicon carbide, molybdenum disulfide and organic compounds provides a new research direction for transistor preparation. However, these semiconductor materials all have a common feature. When preparing a transistor, the active layer is obtained by patterning by dry etching. However, in the conventional amorphous silicon process for illustration, a high concentration doped conductive layer needs to be added between the active layer and the source/the drain to reduce the contact resistance between the active layer and the metal layer to form an ohmic contact. Since the high concentration doped conductive layer is usually patterned by dry etching, and the dry etching causes damage to the active layer of the semiconductor material, such as graphene, carbon nanotubes and silicon carbide. Therefore, it is extremely important to develop a transistor preparation process for protecting the novel semiconductor materials.

SUMMARY OF THE INVENTION

In view of the deficiencies of the prior art, the present invention provides a manufacturing method of a thin film transistor, which can avoid damage to the active layer by dry etching and can improve the performance of the transistor.

For realizing the aforesaid objective, the present invention provides the following technical solutions:

a manufacturing method of a thin film transistor, comprising:

providing a substrate;

sequentially preparing a gate, a gate insulation layer and an active layer on the substrate;

preparing an etching stopper layer on the active layer, which is same as a pattern of the gate and right opposite to the pattern of the gate;

depositing an ohmic contact layer film on the etching stopper layer and the active layer, and depositing a source drain conductive film on the ohmic contact layer film;

processing the source drain conductive film by a wet etching process to form a source and a drain, which are patterned;

processing the ohmic contact layer film by a dry etching process to form an ohmic contact layer, which is patterned to remove the ohmic contact layer film in a channel region between the source and the drain;

removing the etching stopper layer by a wet etching process.

As one of the embodiments, preparing the gate on the substrate comprises:

depositing a conductive film covering an entire surface on the substrate;

depositing a first photoresist film on the conductive film;

exposing and developing the first photoresist film to obtain a first photoresist pattern;

removing the conductive film not covered by the first photoresist pattern by wet etching and elution with an acid solution to obtain the gate, which is patterned.

As one of the embodiments, the conductive film is made of ITO, Mo/A, Ti/Cu, Cr/Au or Ag.

As one of the embodiments, preparing the etching stopper layer on the active layer comprises:

depositing an etching stopper layer film covering an entire surface on the active layer;

depositing a second photoresist film on the etching stopper layer film;

exposing and developing the second photoresist film to obtain a second photoresist pattern;

removing the etching stopper layer film not covered by the second photoresist pattern by wet etching and elution with an acid solution to obtain the etching stopper layer, which is patterned.

As one of the embodiments, the etching stopper layer film is made of ITO (Indium Tin Oxide), Mo/Al, Ti/Cu, metal oxide or Ag.

As one of the embodiments, the ohmic contact layer film is made of phosphorus doped silicon, boron doped silicon, arsenic doped silicon, nitrogen doped silicon or aluminum doped silicon.

As one of the embodiments, the manufacturing method of the thin film transistor further comprises: preparing a passivation layer in the channel region between the source and the drain after removing the etching stopper layer.

As one of the embodiments, preparing the passivation layer comprises:

preparing a passivation protective film on an entire surface of the source, the drain and the active layer by atomic layer deposition or chemical vapor deposition;

patterning the passivation protective film to retain only the passivation protective film right opposite to the gate to obtain the passivation layer.

As one of the embodiments, the passivation protective film is made of an organic insulating material, $SiN_x$, $SiO_2$, $HfO_2$ or $Al_2O_3$.

The etching stopper layer is disposed above the channel of the transistor before preparing the ohmic contact layer in the thin film transistor of the present invention, the damage to the active layer by dry etching of the ohmic contact layer can be effectively avoided to improve the performance of the transistor. Meanwhile, as preparing the passivation layer, the mask originally for preparing the etching stopper layer can be used as the mask for preparing the passivation layer, which realizes the reuse of the mask and also saves the cost of additionally designing the mask.

DETAILED DESCRIPTION OF PREFERRED EMBODIMENTS

For the purpose, technical solutions and advantages of the present invention will become clear and unambiguous, the embodiment of the present invention is described in further detail below with reference to the accompanying drawings, simultaneously. It should be noted that the specific embodiments described herein are merely for explaining the present invention and are not intended to limit the present invention.

Figure 1:
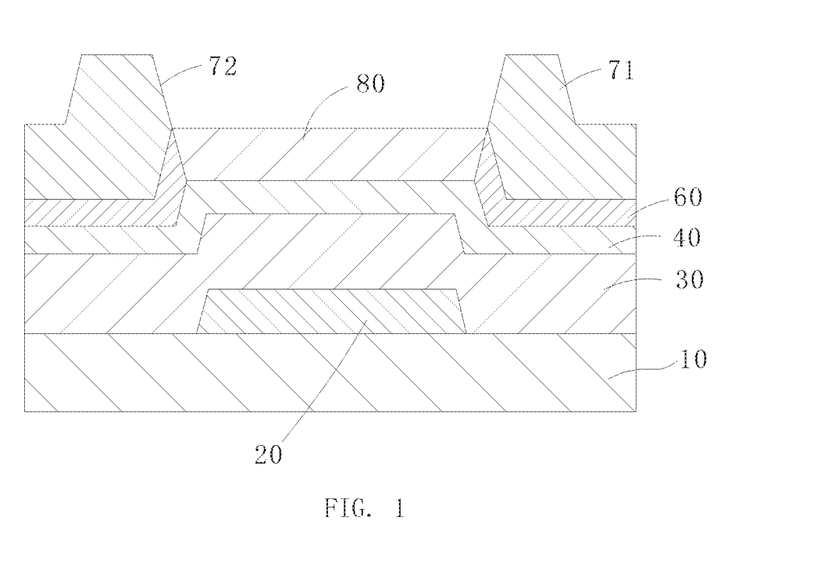
FIG. 1 is a structural diagram of a thin film transistor according to the embodiment of the present invention.

Please refer to FIG. 1. The thin film transistor according to the embodiment of the present invention, mainly comprises a substrate 10, a gate electrode 20, a gate insulating layer 30, an active layer 40 and an ohmic contact layer 60, which are sequentially formed above the substrate 10, and a source 71 and a drain 72 on the ohmic contact layer 60.

The ohmic contact layer 60 is located between the active layer 40 and the source 71/the drain 72, and the upper surface and lower surface of the ohmic contact layer are respectively in contact with the active layer 40 and the source 71/the drain 72, thereby effectively reducing the contact resistance between the active layer 40 and the source 71 and the contact resistance between the active layer 40 and the drains 72, which is beneficial to improve the electrical performance of the thin film transistor. The substrate 10 can be made of PI (Polyimide, polyimide), PET (Polyethylene terephthalate), quartz, $SiO_2$, glass or the like. The gate 20 can be made of ITO, Mo/Al, Ti/Cu, Cr/Au, Ag or the like. The gate insulating layer 30 can be made of an organic insulating material, $SiN_x$, $SiO_2$, $HfO_2$, $Al_2O_3$ or the like. The active layer 40 can be made of graphene, SiC, $MoS_2$, organic semiconductor, carbon nanotubes or the like. The ohmic contact layer 60 is a doped conductive layer, and can be made of phosphorus doped silicon, boron doped silicon, arsenic doped silicon, nitrogen doped silicon or aluminum doped silicon. The source 71 and the drain 72 can be made of ITO, Mo/Al, Ti/Cu, Cr/Au, Ag or the like.

A passivation layer 80 may further be formed in the channel region between the source 71 and the drain 72 on the ohmic contact layer 60. The passivation layer 80 is filled in the channel and has a certain protective effect for the active layer 40 at the bottom. As one of the embodiments, the passivation protective layer 80 can be made of an organic insulating material, $SiN_x$, $SiO_2$, $HfO_2$, $Al_2O_3$.

Figure 2:
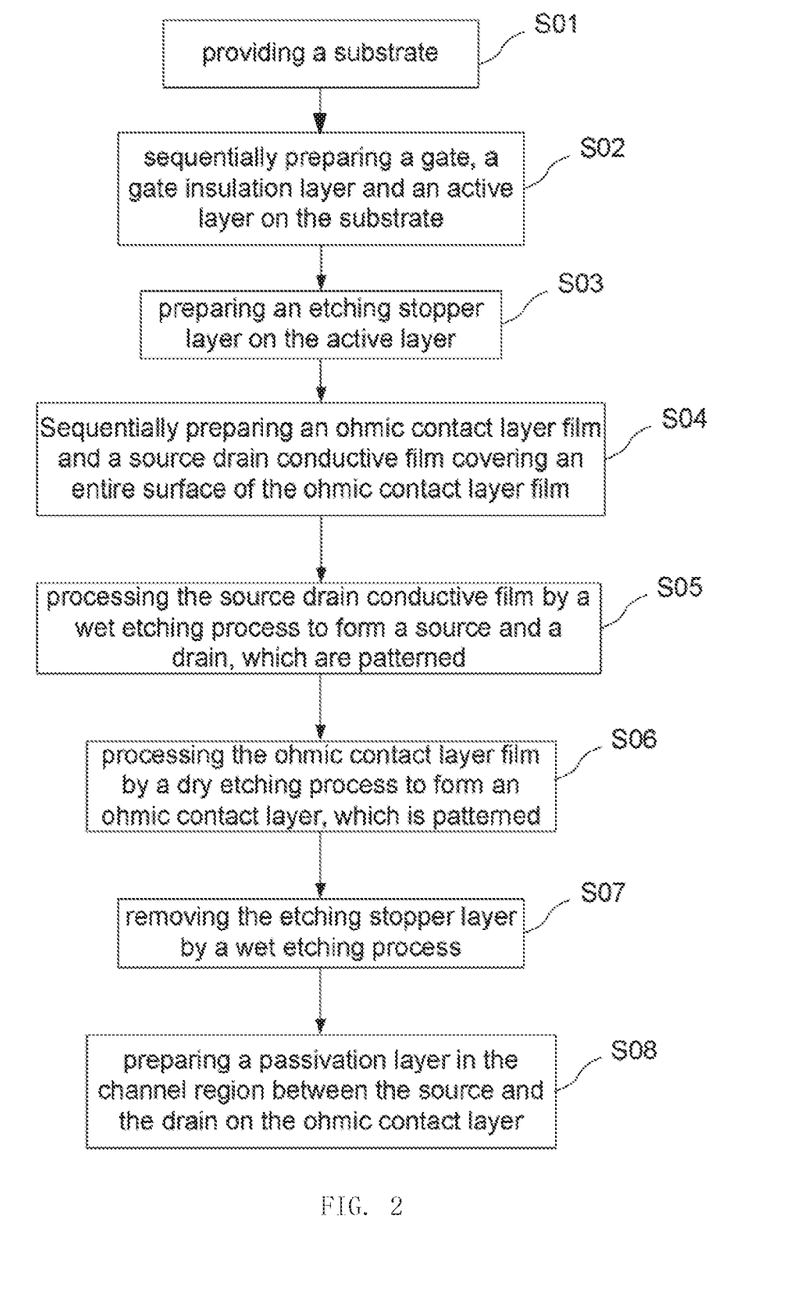
FIG. 2 is a flowchart of a manufacturing method of a thin film transistor according to the embodiment of the present invention.
Figure 3A:
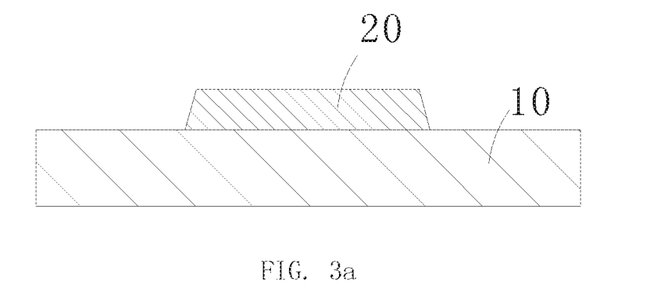
FIGS. 3a to 3l are structural diagrams after implementing the respective steps of the process of the thin film transistor according to the embodiment of the present invention.
Figure 3B:
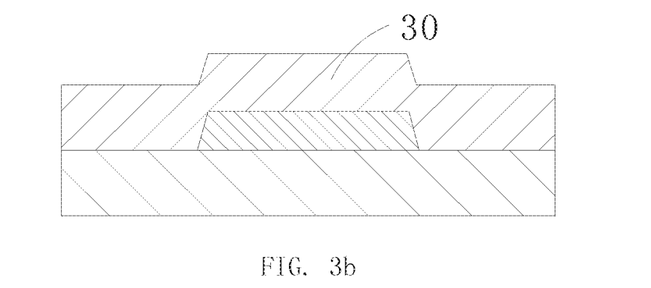
Figure 3C:
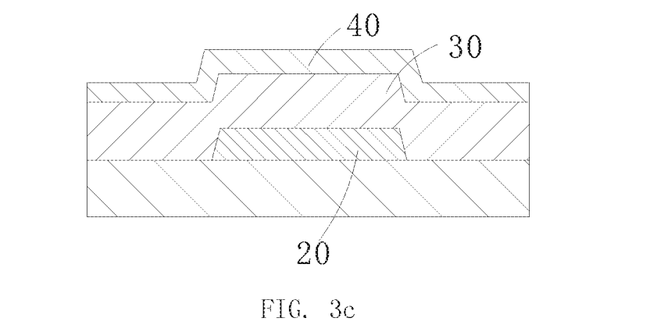
Figure 3D:
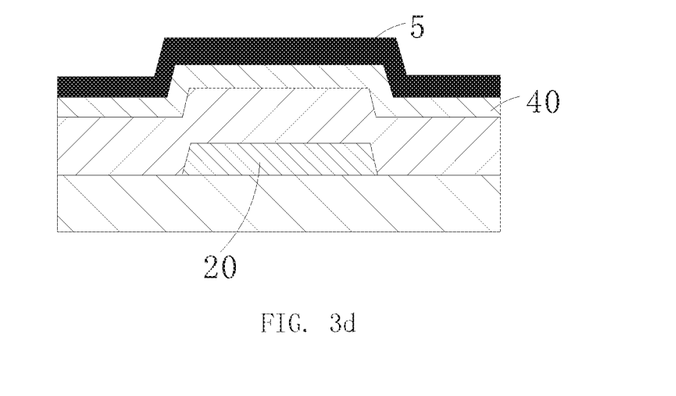
Figure 3E:
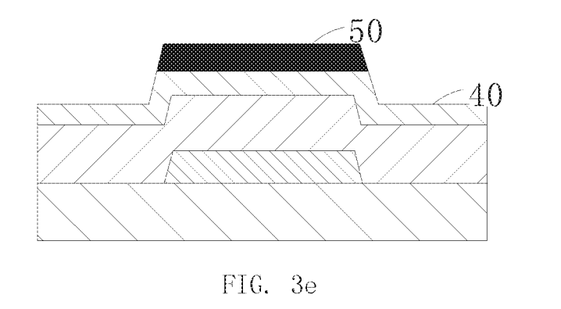
Figure 3F:
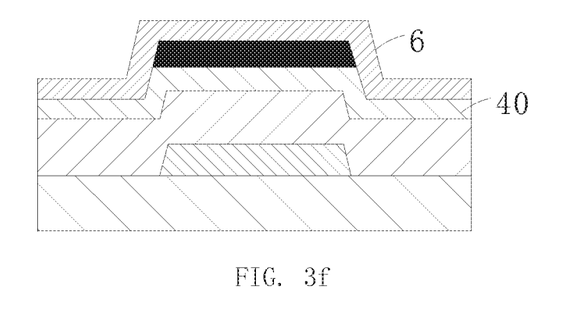
Figure 3G:
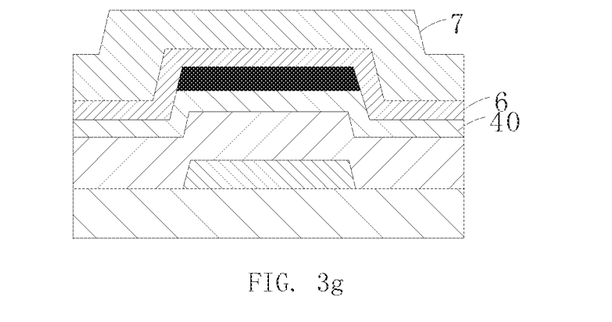
Figure 3H:
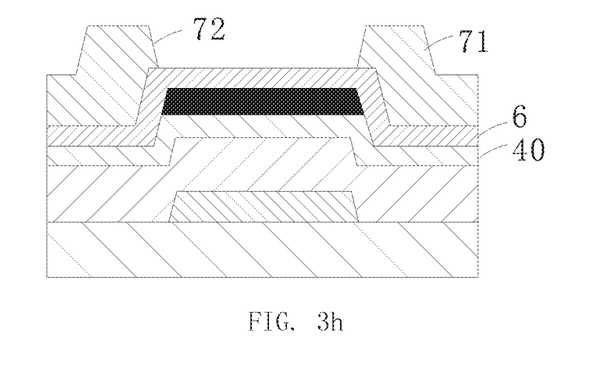
Figure 3I:
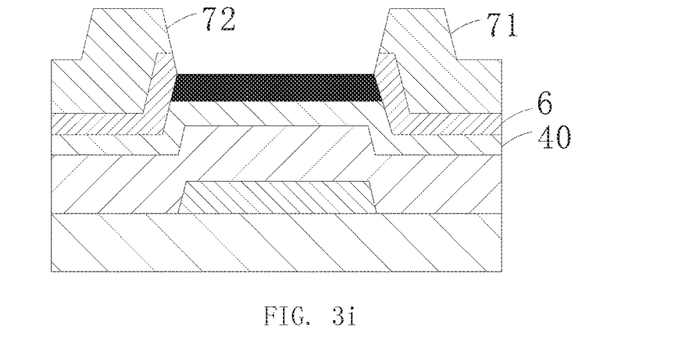
Figure 3J:
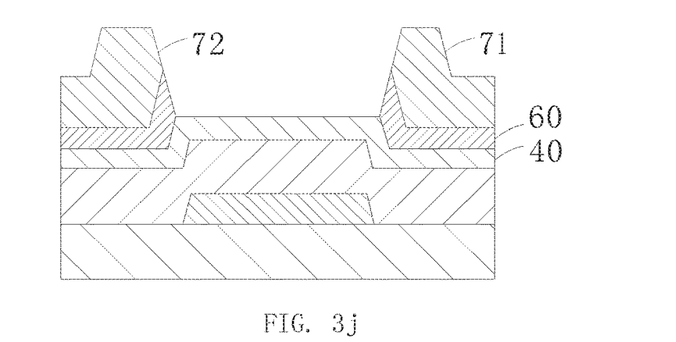
Figure 3K:
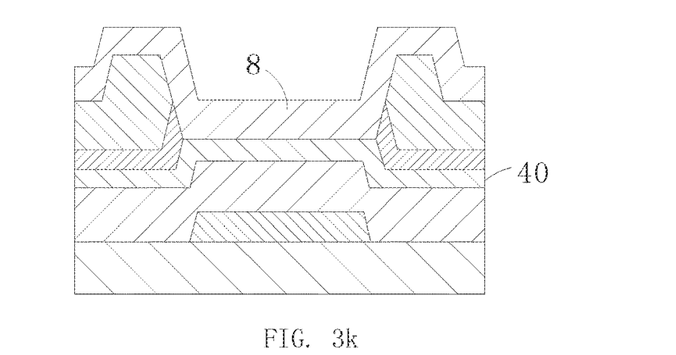
Figure 3L:
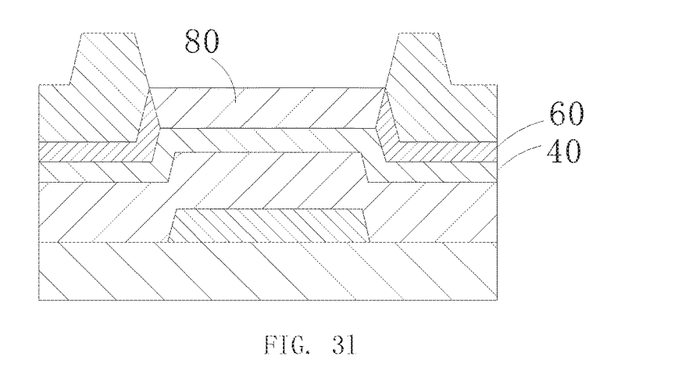

As shown in FIGS. 2 to 3l, the present embodiment provides a manufacturing method of a thin film transistor, mainly comprising:

Step S01, providing a substrate 10, wherein the substrate 10 can be made of a material, such as PI, PET, quartz, $SiO_2$, glass or the like;

Step S02, sequentially preparing a gate electrode 20, a gate insulating layer 30 and an active layer 40 on the substrate 10 (as shown in FIGS. 3a, 3b and 3c);

The process of preparing the gate electrode 20 on the substrate 10 specifically comprises:

cleaning the substrate 10 and depositing a conductive film covering an entire surface on the substrate 10 by physical vapor deposition (PVD) or evaporation;

depositing a first photoresist film on the conductive film, wherein the conductive film can be made of ITO, Mo/Al, Ti/Cu, Cr/Au or Ag;

exposing and developing the first photoresist film to remove the unexposed photoresist and to leave only the light-cured photoresist to form a first photoresist pattern, and then removing the residual conductive film material not covered by the first photoresist pattern by wet etching and elution with an acid solution to obtain the gate 20, which is patterned.

The process of preparing the gate insulating layer 30 on the substrate 10 specifically comprises: after cleaning the substrate 10 on which the gate 20 is prepared, preparing the gate insulating layer 30 on an entire surface of the substrate 10 by atomic layer deposition (ALD) or chemical vapor deposition (CVD), wherein the gate insulating layer 30 covers the substrate 10 and the gate 20 at the same time.

The process of preparing the active layer 40 on the substrate 10 specifically comprises: after cleaning the substrate 10 on which the gate insulating layer 30 is formed, preparing a semiconductor film by a solution process or a transfer process, and then coating photoresist on the surface of the semiconductor film, and exposing and developing with the mask to remove residual photoresist to form the photoresist, which is patterned, and then implementing plasma dry etching to the semiconductor film to elute the residual semiconductor film material for patterning the semiconductor film to obtain the channel active layer 40.

Step S03, preparing an etching stopper layer 50 (as shown in FIGS. 3d, 3e) on the active layer 40, which is same as a pattern of the gate 20 and right opposite to the pattern of the gate 20;

wherein forming the etching stopper layer 50 on the active layer 40 specifically comprises:

depositing an etching stopper layer film 5 covering an entire surface on the active layer 40 by physical vapor deposition (PVD) or evaporation, wherein the etching stopper layer film 5 is a metal film or a metal oxide film, such as ITO, Mo/Al, Ti/Cu, metal oxide or Ag;

depositing a second photoresist film on the etching stopper layer film 5;

exposing and developing the second photoresist film to obtain a second photoresist pattern; removing the etching stopper layer film 5 not covered by the second photoresist pattern by wet etching and elution with an acid solution to obtain the etching stopper layer 50, which is patterned, wherein after the etching stopper layer 50 is prepared, it can protect the underlying active layer 40, thereby avoiding damage to specific areas of the active layer by subsequent processes.

Step S04, depositing an ohmic contact layer film 6 (as shown in FIG. 3f) on the surface of the active layer 40 and the etching stopper layer 50, and depositing a source drain conductive film 7 on the surface of the ohmic contact layer film 6 (as shown in FIG. 3g);

As one of the embodiments, the ohmic contact layer film 6 is made of phosphorus doped silicon, boron doped silicon, arsenic doped silicon, nitrogen doped silicon or aluminum doped silicon. In foregoing Step S04, the ohmic contact layer film 6 is prepared by chemical vapor deposition (CVD), and the source drain conductive film 7 is made of ITO, Mo/Ai, Ti/Cu, Cr/Au, Ag or the like, and is deposited on the substrate 10 by physical vapor deposition (PVD) or evaporation.

Step S05, processing the source drain conductive film 7 by a wet etching process to form a source 71 and a drain 72 (as shown in FIG. 3h), which are patterned, wherein in this embodiment, the photoresist is first coated on the surface of the source drain conductive film 7, and the photoresist is exposed and developed to pattern the same, and then the source drain conductive film 7 is etched by a acid solution through the patterned photoresist, and the source drain conductive film material covered by the photoresist is protected, and the source drain conductive film material not covered by the photoresist is exposed, etched and removed, and then the remaining material is dried to form the source 71 and the drain 72, which are patterned.

Step S06, processing the ohmic contact layer film 6 by a dry etching process to form an ohmic contact layer 60, which is patterned to remove the ohmic contact layer film 6 (as shown in FIG. 3*i*) in a channel region between the source 71 and the drain 72;

Specifically, the ohmic contact layer film 6 under the source drain conductive film 7 is processed by plasma dry etching to penetrate the ohmic contact layer film under the channel region between the source 71 and the drain 72 to expose the underlying etching stopper layer 50, and then cleaning is implemented to remove the residual ohmic contact layer film material. Since the channel region where the etching stopper layer 50 is located between the source 71 and the drain 72 is right above the active layer 40, in the process of dry etching the ohmic contact layer film under the channel region, the etching stopper layer 50 can be used as a protective layer to avoid the damage to the active layer 40 by the dry etching process.

Step S07, removing the etching stopper layer 50 (as shown in FIG. 3*j*) by a wet etching process with a acid solution to expose the active layer 40 in the channel;

Step S08, preparing a passivation layer 80 (as shown in FIGS. 3*k*, 3*l*) in the channel region between the source 71 and the drain 72 on the ohmic contact layer 60, so that the passivation layer 80 can cover and protect the active layer 40 under the channel, wherein the process of preparing the passivation layer 80 specifically comprises:

preparing a passivation protective film 8 on an entire surface of the source 71, the drain 72 and the active layer 40 by atomic layer deposition (ALD) or chemical vapor deposition (CVD);

patterning the passivation protective film 8 to retain only the passivation protective film 8 right opposite to the gate 20 to obtain a passivation layer. Here, the passivation protective film 8 is made of an organic insulating material, $SiN_x$, $SiO_2$, $HfO_2$ or $Al_2O_3$.

In the process of preparing the passivation layer 80, the pattern of the passivation layer 80 is consistent with the pattern of the etching stopper layer 50, and the two can share the same mask, thereby realizing the reuse of the mask to save one mask design and the production cost.

The etching stopper layer is disposed above the channel of the transistor before preparing the ohmic contact layer in the thin film transistor of the present invention, the damage to the active layer by dry etching of the ohmic contact layer can be effectively avoided to improve the performance of the transistor; meanwhile, as preparing the passivation layer, the mask originally for preparing the etching stopper layer can be used as the mask for preparing the passivation layer, which realizes the reuse of the mask and also saves the cost of additionally designing the mask.

Above are only specific embodiments of the present application, the scope of the present application is not limited to this, and to any persons who are skilled in the art, change or replacement which is easily derived should be covered by the protected scope of the application. Thus, the protected scope of the application should go by the subject claims.

What is claimed is:

1. A manufacturing method of a thin film transistor, comprising:
    providing a substrate;
    sequentially preparing a gate, a gate insulation layer and an active layer on the substrate;
    preparing an etching stopper layer on the active layer, which is exactly same as a pattern of the gate in area and right oppositely above the pattern of the gate, wherein the etching stopper layer is made of ITO, Mo/Al, Ti/Cu, metal oxide or Ag;
    depositing an ohmic contact layer film on the etching stopper layer and the active layer, and depositing a source drain conductive film on the ohmic contact layer film;
    processing the source drain conductive film by a wet etching process to form a source and a drain, which are patterned;
    processing the ohmic contact layer film by a dry etching process to form an ohmic contact layer, which is patterned to remove the ohmic contact layer film in a channel region between the source and the drain;
    completely removing the etching stopper layer by a wet etching process.

2. The manufacturing method of the thin film transistor according to claim 1, wherein preparing the gate on the substrate comprises:
    depositing a conductive film covering an entire surface on the substrate;
    depositing a first photoresist film on the conductive film;
    exposing and developing the first photoresist film to obtain a first photoresist pattern;
    removing the conductive film not covered by the first photoresist pattern by wet etching and elution with an acid solution to obtain the gate, which is patterned.

3. The manufacturing method of the thin film transistor according to claim 2, wherein the conductive film is made of ITO, Mo/Al, Ti/Cu, Cr/Au or Ag.

4. The manufacturing method of the thin film transistor according to claim 1, wherein preparing the etching stopper layer on the active layer comprises:
    depositing an etching stopper layer film covering an entire surface on the active layer;
    depositing a second photoresist film on the etching stopper layer film;
    exposing and developing the second photoresist film to obtain a second photoresist pattern;
    removing the etching stopper layer film not covered by the second photoresist pattern by wet etching and elution with an acid solution to obtain the etching stopper layer, which is patterned.

5. The manufacturing method of the thin film transistor according to claim 1, wherein the ohmic contact layer film is made of phosphorus doped silicon, boron doped silicon, arsenic doped silicon, nitrogen doped silicon or aluminum doped silicon.

6. The manufacturing method of the thin film transistor according to claim 1, further comprising: preparing a passivation layer in the channel region between the source and the drain after removing the etching stopper layer.

7. The manufacturing method of the thin film transistor according to claim 6, wherein preparing the passivation layer comprises:
    preparing a passivation protective film on an entire surface of the source, the drain and the active layer by atomic layer deposition or chemical vapor deposition;
    patterning the passivation protective film to retain only the passivation protective film right opposite to the gate to obtain the passivation layer.

8. The manufacturing method of the thin film transistor according to claim 7, wherein the passivation protective film is made of an organic insulating material, $SiN_x$, $SiO_2$, $HfO_2$ or $Al_2O_3$.

9. The manufacturing method of the thin film transistor according to claim 2, further comprising: preparing a passivation layer in the channel region between the source and the drain after removing the etching stopper layer.

10. The manufacturing method of the thin film transistor according to claim 9, wherein preparing the passivation layer comprises:
preparing a passivation protective film on an entire surface of the source, the drain and the active layer by atomic layer deposition or chemical vapor deposition;
patterning the passivation protective film to retain only the passivation protective film right opposite to the gate to obtain the passivation layer.

11. The manufacturing method of the thin film transistor according to claim 10, wherein the passivation protective film is made of an organic insulating material, $SiN_X$, $SiO_2$, $HfO_2$ or $Al_2O_3$.

12. The manufacturing method of the thin film transistor according to claim 3, further comprising: preparing a passivation layer in the channel region between the source and the drain after removing the etching stopper layer.

13. The manufacturing method of the thin film transistor according to claim 12, wherein preparing the passivation layer comprises:
preparing a passivation protective film on an entire surface of the source, the drain and the active layer by atomic layer deposition or chemical vapor deposition;
patterning the passivation protective film to retain only the passivation protective film right opposite to the gate to obtain the passivation layer.

14. The manufacturing method of the thin film transistor according to claim 13, wherein the passivation protective film is made of an organic insulating material, $SiN_X$, $SiO_2$, $HfO_2$ or $Al_2O_3$.

15. The manufacturing method of the thin film transistor according to claim 4, further comprising: preparing a passivation layer in the channel region between the source and the drain after removing the etching stopper layer.

16. The manufacturing method of the thin film transistor according to claim 15, wherein preparing the passivation layer comprises:
preparing a passivation protective film on an entire surface of the source, the drain and the active layer by atomic layer deposition or chemical vapor deposition;
patterning the passivation protective film to retain only the passivation protective film right opposite to the gate to obtain the passivation layer.

17. The manufacturing method of the thin film transistor according to claim 16, wherein the passivation protective film is made of an organic insulating material, $SiN_X$, $SiO_2$, $HfO_2$ or $Al_2O_3$.

18. A manufacturing method of a thin film transistor, comprising:
providing a substrate;
sequentially preparing a gate, a gate insulation layer and an active layer on the substrate, wherein preparing the gate on the substrate comprises:
depositing a conductive film covering an entire surface on the substrate;
depositing a first photoresist film on the conductive film;
exposing and developing the first photoresist film to obtain a first photoresist pattern; and
removing the conductive film not covered by the first photoresist pattern by wet etching and elution with an acid solution to obtain the gate, which is patterned;
preparing an etching stopper layer on the active layer, which is exactly same as a pattern of the gate in area and right oppositely above the pattern of the gate, wherein preparing the etching stopper layer on the active layer comprises:
depositing an etching stopper layer film covering an entire surface on the active layer;
depositing a second photoresist film on the etching stopper layer film;
exposing and developing the second photoresist film to obtain a second photoresist pattern; and
removing the etching stopper layer film not covered by the second photoresist pattern by wet etching and elution with an acid solution to obtain the etching stopper layer, which is patterned, wherein the etching stopper layer is made of ITO, Mo/Al, Ti/Cu, metal oxide or Ag;
depositing an ohmic contact layer film on the etching stopper layer and the active layer, and depositing a source drain conductive film on the ohmic contact layer film;
processing the source drain conductive film by a wet etching process to form a source and a drain, which are patterned;
processing the ohmic contact layer film by a dry etching process to form an ohmic contact layer, which is patterned to remove the ohmic contact layer film in a channel region between the source and the drain; and
completely removing the etching stopper layer by a wet etching process.

* * * * *